Aug. 8, 1967 N. F. DAMON ET AL 3,335,327

HOLDER FOR ATTACHING FLAT PACK TO PRINTED CIRCUIT BOARD

Filed Jan. 6, 1965 3 Sheets-Sheet 1

Inventors:
Neil F. Damon,
Ralph C. Hoy,
by Silver & Michaelson
Att'ys.

HOLDER FOR ATTACHING FLAT PACK TO PRINTED CIRCUIT BOARD

Filed Jan. 6, 1965

3 Sheets-Sheet 2

Inventors:
Neil F. Damon,
Ralph C. Hoy,
by Silts & Michaelson
Att'ys.

Aug. 8, 1967 N. F. DAMON ET AL 3,335,327
HOLDER FOR ATTACHING FLAT PACK TO PRINTED CIRCUIT BOARD
Filed Jan. 6, 1965 3 Sheets-Sheet 3

Inventors:
Neil F. Damon,
Ralph C. Hoy,
by Silter + Michaelson
Att'ys.

United States Patent Office 3,335,327

Patented Aug. 8, 1967

3,335,327

HOLDER FOR ATTACHING FLAT PACK TO PRINTED CIRCUIT BOARD

Neil F. Damon, Cumberland, R.I., and Ralph C. Hoy, Attleboro, Mass., assignors to Augat, Inc., Attleboro, Mass., a corporation of Massachusetts Filed Jan. 6, 1965, Ser. No. 423,710
4 Claims. (Cl. 317—101)

The present invention relates generally to microminiature integrated circuits, sometimes referred to in the art as "Flat Packs," and is more particularly concerned with a novel and improved socket for said circuits.

A primary object of the instance invention is the provision of novel and improved socket means for micro-miniature integrated circuits which sockets are readily adapted for use in so-called bread board assemblies and as testing sockets.

As is well known in the art, the aforesaid micro-miniature integrated circuits comprise an extremely minute wafer-like housing having multiple leads protruding from the sides thereof. The insides of the wafer-like housing has therein small electronic parts, such as transistors, diodes, resistors, capacitors, etc. all interconnected to provide a desired electronic system or circuit on an extremely miniaturized scale. The usual practice is to associate and assemble said integrated circuit with a printed circuit board or card, it being understood that said circuit board has circuitry printed therein for engagement with the leads extending from the integrated circuit housing. The problem which has existed heretofore has been to provide adequate means for properly and positively mounting the integrated circuit on the circuit board in such a way that there will be no short circuiting of adjacent printed circuit leads and/or of adjacent leads of the integrated circuit. In addition, since integrated circuits of the instant type are inherently extremely small and delicate, likelihood of breakage of the leads presents a difficult problem.

It is therefore an important object of our invention to provide means for operatively mounting an integrated circuit on a circuit board so that proper electrical contact will be made between the integrated circuit leads and the printed circuit leads, without danger of short circuiting and damage to the integrated circuit.

Another object is the provision of mounting means of the character abovedescribed wherein the integrated circuit is not permanently attached to the circuit board.

A further object is the provision of mounting means of the character described wherein the integrated circuit is held firmly and yet resiliently against movement, thus reducing the likelihood of lead breakage.

A further object of our invention is the provision of a novel and improved bread board assembly comprising an integrated circuit.

Still another object is the provision of a novel and improved socket for integrated circuits that not only is of use and value in connection with testing and bread boarding, but which also can be used as a carrier in which the integrated circuit can be safely shipped.

A further object is the provision of a socket for integrated circuits that enables the latter to be quickly and effectively assembled on a printed circuit board, but which at the same time is economically feasible to manufacture and which is durable in use.

Other objects, features and advantages of the invention will become apparent as the description thereof proceeds when considered in connection with the accompanying illustrative drawings.

In the drawings which illustrate the best mode presently contemplated for carrying out the present invention:

Figure 1:
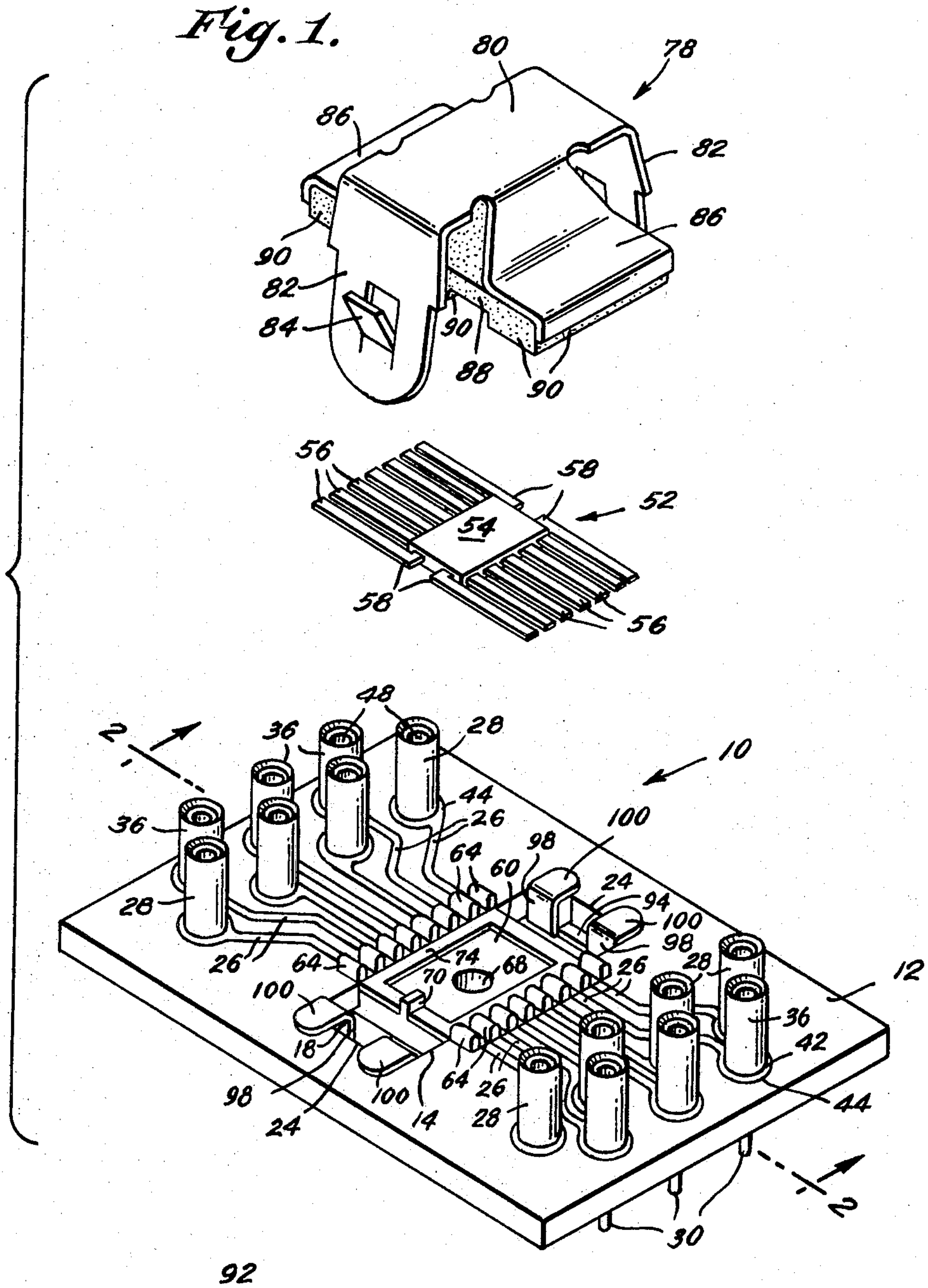
FIG. 1 is an exploded perspective view of a bread board assembly comprising the instant invention.

Referring now to the drawings, and more particularly to FIG. 1 thereof, there is shown a bread board assembly generally designated as 10. The assembly 10 comprises a printed circuit board or card 12 of suitable insulating material such as glass epoxy, and having an irregularly shaped opening 14 centrally disposed therein, note FIG. 8. For reasons hereinafter to be more fully described, the opening 14 is provided with oppositely disposed shoulders 16 at each end thereof and a second pair of oppositely disposed shoulders 18 located outwardly of each pair of shoulders 16. In effect, the shoulders 16 define a central portion 20 while the shoulders 18 define a pair of end portions 22 each having a central cutout 24.

Figure 2:
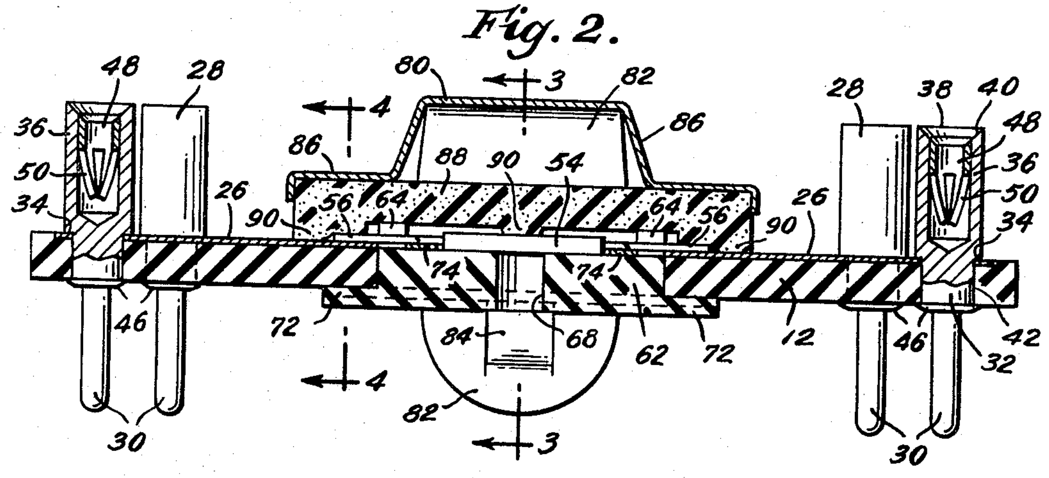
FIG. 2 is an enlarged section taken on line 2—2 of FIG. 1.
Figure 8:
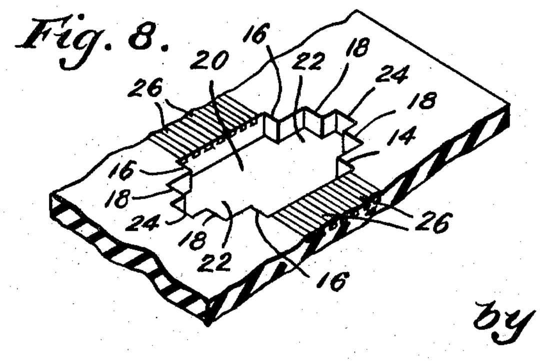
FIG. 8 is a fragmentary perspective view of a part of the circuit board utilized in our invention.

Board 12 has embedded therein, in a manner well known in the art, a plurality of printed circuit leads 26 extending outwardly from central portion 20 of opening 14 in spaced parallel relationship, as will be seen most clearly in FIG. 8. As will be seen most clearly in FIG. 1, the printed circuit leads 26 are each associated with and connected to integral pin jacks 28, and, as will be seen most clearly in FIG. 2, the jacks 28 comprise a bottom pin 30 extending downwardly from board 12, an enlarged shank portion 32 terminating at its upper end in an annular shoulder 34 and an upwardly extending hollow sleeve 36 having an open upper end 38 inwardly beveled as at 40. As aforestated, the jack 28 is preferably of integral construction and is made from any electrically conductive metal, such as brass. It will be understood that each jack 28 is mounted in an opening 42, said openings being dimensioned so as to snugly receive the shank portions 32. It will further be noted that the openings 42 have therearound a circular eye 44 that is actually a part of the printed circuit leads 26. Thus, when each jack 28 is mounted on the circuit board 12, the shank 32 will be slidingly received in the opening 42 until annular shoulder 34 abuts and engages the circular eye 44. In order to securely maintain the jack 28 in its assembled position on the board 12, the lower extremity of shank 32 is peened outwardly, as at 46, whereby the jack 28 is securely maintained against axial movement. In addition, where desirable, the shoulder 34 may be soldered to eye 44. Each hollow sleeve 36 has mounted therein a split contact of beryllium copper or the like 48, said contact having inwardly extending resilient fingers 50. It will be understood that the contact 48 may be secured within sleeve 36 by any suitable means, although in practice it has been found that the contact may be pressed therein and maintained by friction. It will be understood that when a pin of the correct diameter is inserted into the contact 48, the resilient fingers 50 make a biting contact with the male pin, thus insuring positive electrical contact.

A micro-miniature integrated circuit, sometimes referred to in the art as a flat pack, is shown generally at 52 in FIG. 1. The integrated circuit 52 comprises a wafer-like housing 54 which has located therein the miniature electronic parts (not shown) such as transistors, diodes, resistors, capacitors, etc., all interconnected to provide the desired electronic system or circuit. A plurality of leads 56 extend from the housing 54, said leads extending from a plurality of sides of the housing and being in spaced, substantially parallel relation to each other. As will be noted, the outside leads 56 extend from the end walls of the housing 54 and hence are provided with a right-angle bend as at 58 in order to maintain the desired spaced parallel relationship with the other leads. The means by which the integrated circuit 52 is mounted on circuit board 12 so as to establish the desired electrical connection between the leads 56 and printed circuit leads 26 will now be described.

Figure 5:
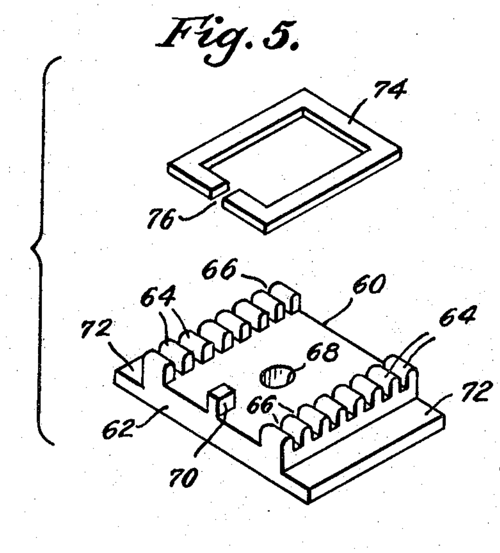
FIG. 5 is an exploded perspective view of the lead separator that forms a part of our invention.
Figure 4:
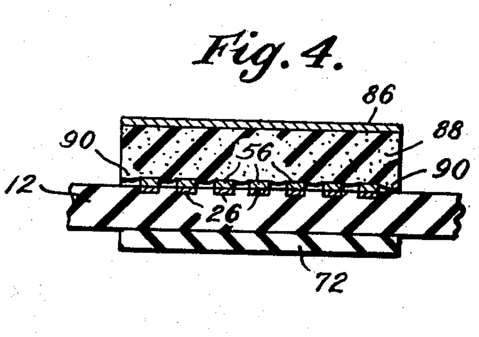
FIG. 4 is a section taken on line 4—4 of FIG. 2.

Referring to FIG. 5, there is shown a lead separator 60, preferably of molded plastic, said lead separator having a body portion 62, the opposite ends of which have a series of upstanding spaced integral barriers 64 defining therebetween a series of spaced stalls 66. An opening 68 extends through the central portion of the body 62, and at one edge of said body there is provided a centrally positioned upstanding lug 70. A pair of oppositely disposed outwardly extending flanges 72 extend from the body portion 62. In assembly, the lead separator 60 is inserted upwardly into opening 14 in board 12, it being understood that body portion 62 is dimensioned so as to be snugly received within the central portion 20 of opening 14. As will be seen most clearly in FIG. 2, the outwardly extending flanges 72 engage the lower surface of the board 12 and are secured thereto by any suitable means, such as cementing or the like. When the lead separator 60 has been assembled to board 12 in the manner just described, the stalls or spaces 66 are in alignment with the printed circuit leads 26 in the upper surface of board 12. With the lead separator 60 so assembled to the circuit board 12, the integrated circuit 52 is positioned on the lead separator with the relative positioning illustrated in FIG. 1 wherein the leads 56 each extend through a stall or space 64 into overlying engagement with a printed circuit lead 26. The projection 70 will automatically be positioned between the right-angle bends of one pair of outer leads 56 and will function to prevent sidewise sliding movement of the integrated circuit. As will be apparent, the positioning of the leads 56 between the barriers 64 will prevent movement of the integrated circuit in a lengthwise direction, and hence it will be seen that the integrated circuit, when so positioned, is incapable of any appreciable movement. In some cases, the integrated circuit 52 may not have outer leads 56 extending from the end walls of the housing 54, whereupon it is desirable to provide an adaptor 74 for snugly receiving the housing 54 in order to prevent undesirable movement thereof. As will be seen most clearly in FIGS. 1 and 5, the adaptor 74 is nothing more than a rectangular frame, preferably of plastic construction, having an opening 76 at one wall thereof for receiving the projection 70. The adaptor is secured to the upper surface of the lead separator 60 by any suitable means, such as cementing or the like, and as will be seen in FIG. 1, provides a shallow enclosure for receiving and maintaining the housing 54. It will be understood that any desirable size adaptor 74 may be used, depending on the size of the integrated circuit being employed. It will further be understood that in some cases use of the adaptor 74 is not necessary, this being particularly true where a larger size housing 54 is utilized and where outer leads extend from the end walls of the housing 54, whereupon the right-angle bends 58 may be located on opposite sides of projection 70 to maintain the integrated circuit against undesirable movement.

Figure 6:
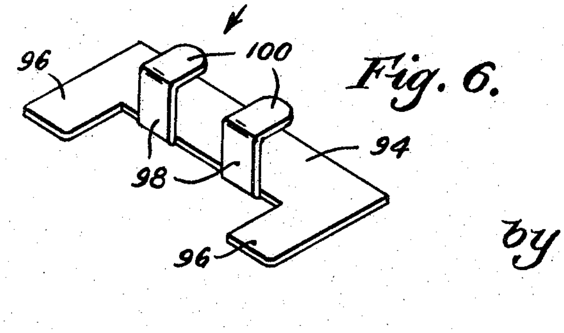
FIG. 6 is a perspective detail of one of the reinforcing pads that forms a part of our invention.
Figure 3:
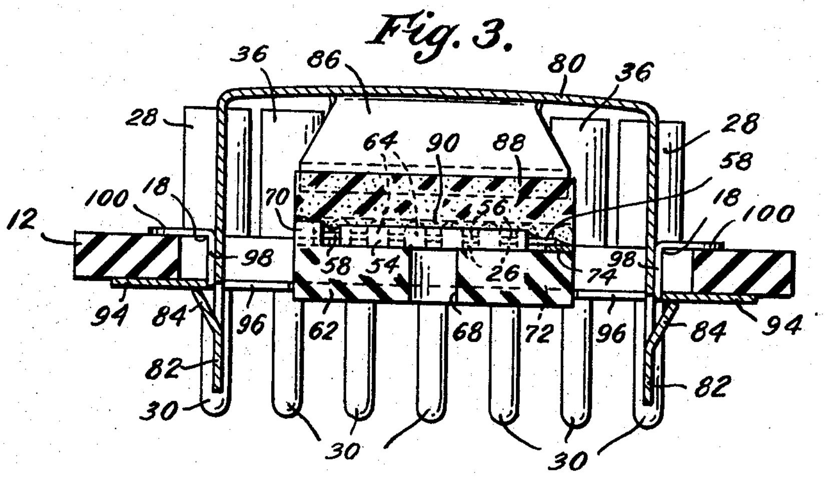
FIG. 3 is a section taken on line 3—3 of FIG. 2.

In order to hold down the integrated circuit 52 when it is positioned on lead separator 60 as above described, a clamp shown generally at 78 is provided. As will be most clearly seen in FIG. 1, clamp 78, which preferably is of any suitable metallic construction, comprises a body portion 80 having a pair of oppositely disposed depending ears 82, each of which having integrally struck therefrom an outwardly extending locking lug 84. Perpendicularly disposed to the ears 82 and likewise depending from body portion 80 are a pair of oppositely disposed and depending arms 86, said arm supporting a resilient pressure pad 88 preferably constructed of silicone rubber or the like. As will be seen most clearly in FIG. 2, the pad 88 is provided with three spaced depending portions 90, one at each end of the pad, and one at the center portion thereof. In order to snap-receive the clamp 78, a pair of reinforcing inserts 92 (FIG. 6) are provided. The inserts 92 are of any suitable metallic construction and comprise a flat plate 94 having a pair of spaced parallel legs 96 at opposite extremities thereof and further having a pair of spaced, upwardly extending arms 98. As will be seen most clearly in FIGS. 1 and 3, the inserts 92 are secured to circuit board 12 at opposite ends of the opening 14, and, more specifically, the plates 94 are located in engagement with the under surface of board 12 so as to underlie the portions 24 of opening 14. The arms 98 are spaced from each other by a distance substantially equal to the width of the portion 24, whereupon said arms 98 extend upwardly against the shoulder 18 and are then bent over at right angles as at 100 in order to secure the inserts 92 to the board 12.

With the inserts 92 so mounted, and with the integrated circuit 52 positioned on lead separator 60 as aforedescribed, the clamp 78 is forced downwardly on the integrated circuit, with the parts in the relative positioning illustrated in FIG. 1, whereupon the ears 82 move downwardly just inside the shoulders 18 until the lugs 84 snap beneath the edge of the plate 94 at the portion thereof located at the bottom of the end openings 24. The function of the end openings 24 is to enable the ears 82 and lugs 84 to move downwardly more freely since the only obstruction to said downward movement will be the portion of the plate 94 located between the arms 98. The inserts 92 provide a reinforcement for the snap-mounting of clamp 78, since the construction of board 12 would not in itself be sufficiently strong to snap-receive the metallic clamp 78. Expressedly differently, the locking lugs 84 would tend to bite into and mutilate the plastic board 12 if the reinforcing inserts 92 were not provided.

When the clamp 78 has been snap-received as above described, the pressure pad 88 will engage and press downwardly against the integrated circuit 52. More specifically, the end depending portions 90 will engage the leads 56 just outwardly of the barriers 64 in order to resiliently press the leads 56 against the printed circuit leads 26 in order to insure good electrical contact therebetween. The center depending portion 90 will engage housing 54 to help maintain the integrated circuit unit against undesirable movement.

When it is desired to remove the integrated circuit 52, it is simply necessary to press inwardly against the ears 82 until the lugs 84 clear the inner edges of plates 94, whereupon the clamp may then be upwardly removed. The integrated circuit 52 may then be removed, and in this connection the opening 68 in lead separator 60 is utilized as an ejection opening wherein a pin may be passed upwardly through the opening 68 in order to dislodge the integrated circuit 52 from its mounting on the lead separator 60.

In operation and use, and with the integrated circuit 52 clamped in position as aforedescribed, the bread board assembly 10 may be stacked on other similar bread boards, it being understood that the pins 30 of one bread board assembly will be received by the contacts 48 of another bread board assembly, whereupon any desired number of these assemblies may be vertically stacked on each other and at the same time be maintained in electrical contact with each other. By the same token, wire jumpers or adaptors which have pins attached to their ends (not shown) can be plugged into the jacks for cross jumping and interconnection to other bread board assemblies. It will be understood that these bread board assemblies may be used for proto-typing a plurality of integrated circuits, or, expressed differently, a complete bread board system or computer could be simulated by the use and interconnection of various bread board assemblies as hereinbefore illustrated and described.

In some cases, it may be desired to solder or weld the leads 56 to the printed circuit leads 26. In such a situation, the lead separator 60 is still highly advantageous in enabling the desired connection to be made between the leads 56 and the leads 26 without cross circuiting and the like. However, where the integrated circuit leads are soldered or welded to the printed circuit leads, it is no longer necessary to utilize the clamp 78, which in turn means that the reinforcing inserts 92 need not be employed.

Figure 7:
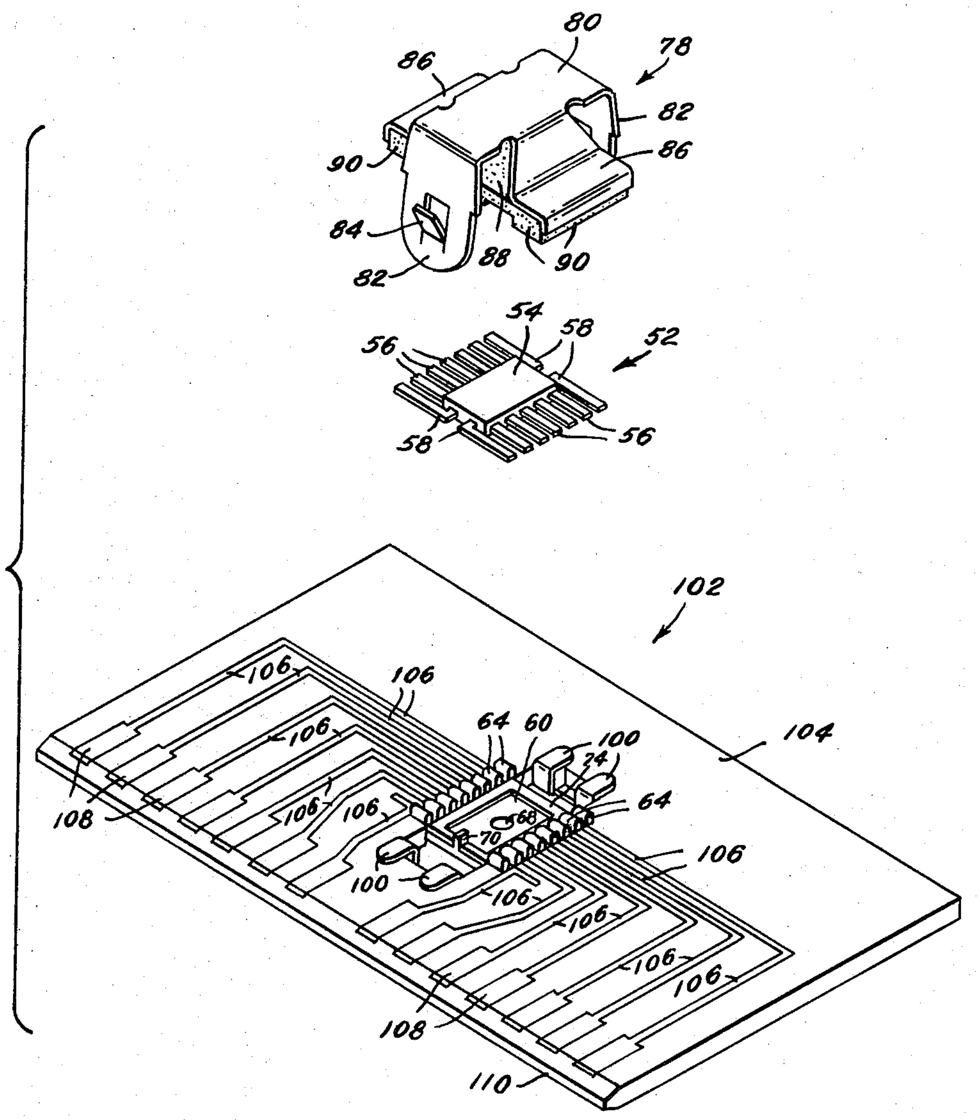
FIG. 7 is an exploded perspective view of a test socket comprising our invention.

Referring now to FIG. 7, another application of the instant invention is illustrated. More specifically, a testing socket is illustrated generally at 102. The testing socket 102 comprises a printed circuit board 104 having printed circuit leads 106 therein. Since the association of integrated circuit 52 with board 104 is identical to that aforedescribed in connection with board 12, no description thereof will again be given. The only difference between the assembly 102 and the aforedescribed assembly 10 is that the former was used for bread board work whereas the latter is used for testing purposes. In this connection, the printed circuit leads 106 in board 104 all extend to one edge of the board and terminates in enlarged contacts 108. As will be clearly seen, this edge of the board is beveled as at 110 in order to facilitate entry of this edge of the board into a standard printed circuit connector (not shown) for test purposes.

It will be understood that the assembly 102 can also be used as a carrier in which integrated circuits can be shipped, the clamp 78 and resilient pressure pad 88 cooperating with the lead separator 60 to maintain the integrated circuit against movement, which in turn reduces the likelihood of lead breakage due to fatigue. When the integrated circuits are so shipped, it will be understood that they will be all ready for testing by the purchaser.

As was the case in connection with the bread board assembly 10, it may, in some instances, be desirable to solder or weld the leads 56 of the integrated circuit 52 to the printed circuit leads 106 in board 104. Here again, where such an assembly is utilized, clamp 78 and reinforcing inserts 92 need not be employed.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. In combination, a printed circuit board having an opening therein, a plurality of printed circuit leads extending away from said opening, a lead separator secured to said board and located in said opening, said separator comprising a flat base portion and a plurality of upstanding barriers adjacent a marginal edge of said base portion defining a series of side-by-side stalls, each of which is in alignment with a printed circuit lead, the combination further comprising an integrated circuit, a housing for said circuit and a plurality of leads extending from said housing, said integrated circuit being mounted on said lead separator with its said leads each positioned in one of said stalls and overlying the aligned printed circuit lead, and means maintaining said integrated circuit leads and said printed circuit lead in firm contact with each other, said means comprising a clamp, said clamp having resilient latching means for detachably snap-seating said clamp to said board in overlying relation to said integrated circuit, said clamp further having a resilient pressure pad engaging said integrated circuit and maintaining it against movement and at the same time urging said integrated circuit leads against said printed circuit leads.

2. The combination of claim 1 further characterized in that said circuit board is provided with reinforcing inserts adjacent said opening, said inserts cooperating with said latching means for detachably mounting said clamp in operative position.

3. The combination of claim 1 further characterized in that said printed circuit leads extend and connect to combined male and female jacks mounted on said board.

4. The combination of claim 1 further characterized in that all of said printed circuit leads extend to one edge of said board and terminate at said edge in spaced contacts, said one edge of the board being chamfered to facilitate entry into a test connector.

References Cited

UNITED STATES PATENTS

| | | | |
|---|---|---|---|
| 2,959,758 | 11/1960 | Geshner et al. | 174—68.5 X |
| 3,184,699 | 5/1965 | Spera | 313—17 |
| 3,205,408 | 9/1965 | Boehm et al. | 317—101 |
| 3,239,719 | 3/1966 | Shower | 174—68.5 X |
| 3,239,793 | 3/1966 | Melia | 174—138.5 |

OTHER REFERENCES

Electronic Equipment Engineering, November 1963, vol. 11, No. 11, page 47.

ROBERT K. SCHAEFER, *Primary Examiner.*

W. C. GARVERT, D. SMITH, *Assistant Examiners.*